(12) United States Patent
Chen

(10) Patent No.: US 11,482,562 B2
(45) Date of Patent: Oct. 25, 2022

(54) METHODS FOR FORMING IMAGE SENSORS

(71) Applicant: Applied Materials, Inc., Santa Clara, CA (US)

(72) Inventor: Taichou Papo Chen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 169 days.

(21) Appl. No.: 17/137,593

(22) Filed: Dec. 30, 2020

(65) Prior Publication Data

US 2022/0208829 A1 Jun. 30, 2022

(51) Int. Cl.
H01L 27/146 (2006.01)

(52) U.S. Cl.
CPC .... H01L 27/14685 (2013.01); H01L 27/1462 (2013.01); H01L 27/1464 (2013.01); H01L 27/14603 (2013.01); H01L 27/14629 (2013.01)

(58) Field of Classification Search
CPC ......... H01L 27/14685; H01L 27/14603; H01L 27/1462; H01L 27/14629; H01L 27/1464
See application file for complete search history.

(56) References Cited

U.S. PATENT DOCUMENTS

| | | | |
|---|---|---|---|
| 6,636,653 B2 | 10/2003 | Miracky et al. | |
| 6,943,051 B2 | 9/2005 | Augusto et al. | |
| 7,972,875 B2 | 7/2011 | Rogers et al. | |
| 9,496,435 B2 | 11/2016 | Wang et al. | |
| 9,530,905 B2 | 12/2016 | Wang et al. | |
| 2007/0012876 A1 | 1/2007 | Lee et al. | |
| 2008/0251872 A1* | 10/2008 | Kwon | H01L 27/14625 257/E27.111 |
| 2010/0059842 A1 | 3/2010 | Choi | |
| 2010/0173449 A1 | 7/2010 | Cheng et al. | |
| 2011/0220972 A1 | 9/2011 | Masuoka et al. | |
| 2020/0273855 A1 | 8/2020 | Park et al. | |

OTHER PUBLICATIONS

International Search Report and Written Opinion for PCT/US2021/064840 dated Apr. 20, 2022.

* cited by examiner

*Primary Examiner* — David Vu
(74) *Attorney, Agent, or Firm* — Moser Taboada

(57) ABSTRACT

Methods for forming image sensors that leverage cavity profiles and induced stresses. In some embodiments, the method includes forming a cavity in a substrate where the cavity has a cavity profile that is configured to accept a sensor pixel structure for an image sensor, forming at least one passivation layer in the cavity, and forming at least one optical layer in the cavity on at least a portion of one of the at least one passivation layer. The at least one optical layer is configured to provide, at least, pixel-to-pixel optical isolation of the sensor pixel structure. The method further includes forming the sensor pixel structure in the cavity on the at least one optical layer of the sensor pixel structure where the cavity profile is configured to control stress on the sensor pixel structure.

20 Claims, 8 Drawing Sheets

METHODS FOR FORMING IMAGE SENSORS

FIELD

Embodiments of the present principles generally relate to semiconductor manufacturing.

BACKGROUND

Photodiodes are typically constructed using implantation techniques that require many dopant (sometimes 30 or more) treatments at different energy levels to form pixels. The complex dopant processes result in low throughput which yields a higher cost per unit manufactured. Accordingly, the inventor has provided methods for forming photodiodes that dramatically increase the manufacturing throughput and are compatible with more workflows such as CMOS workflows, leading to substantially reduced manufacturing costs and superior performance.

SUMMARY

Methods for forming image sensors are provided herein.

In some embodiments, a method for forming an image sensor may comprise forming a cavity on a substrate, the cavity having a cavity profile and configured to accept a sensor pixel structure of the image sensor, forming at least one passivation layer in the cavity, forming at least one optical layer in the cavity on at least a portion of one of the at least one passivation layer, wherein the at least one optical layer is configured to provide, at least, pixel-to-pixel optical isolation of the sensor pixel structure, and forming the sensor pixel structure in the cavity on the at least one optical layer of the sensor pixel structure, wherein the cavity profile is configured to control stress on the sensor pixel structure.

In some embodiments, the method may further include forming the sensor pixel structure using an atomic layer deposition (ALD) process, a chemical vapor deposition (CVD) process, or a molecular beam epitaxy (MBE) process and crystallizing the sensor pixel structure, wherein the at least one passivation layer or the at least one optical layer is conformally deposited into the cavity, wherein the image sensor includes multiple stacked sensor pixel structures within the cavity separated by optical layers, wherein the at least one optical layer includes a distributed Bragg reflector (DBR) mirror layer or a DBR filter layer, depositing a charge passivation layer in the cavity prior to forming the sensor pixel structure, the charge passivation layer configured to increase a quantum efficiency of the image sensor by altering a work function or an electric field of the sensor pixel structure, adjusting an amount of stress applied to the sensor pixel structure prior to or after formation of the sensor pixel structure in the cavity, wherein adjusting the amount of stress increases a quantum efficiency of the sensor pixel structure, wherein the amount of stress is adjusted by placing at least one isolation structure external of the cavity of a material different from the substrate beside the cavity and wherein the amount of stress is further adjusted by differing material selections of the material different from the substrate for the external isolation structure, wherein the at least one isolation structure is at least one shallow trench isolation structure or at least one deep trench isolation structure gapfilled with the material different from the substrate, wherein the amount of stress is adjusted by curing processes, implanting dopants, or annealing processes prior to or after forming the sensor pixel structure, etching a bottom of the cavity to reveal substrate material and forming the sensor pixel structure in the cavity using an epitaxial growth process, forming a plurality of stacked sensor pixel structures in the cavity separated by optical layers and forming a plurality of electrical contact vias to each of the plurality of stacked sensor pixel structures only on a single side of the image sensor, and/or wherein the at least one optical layer is formed of a metal material or dielectric material.

In some embodiments, a method for forming an image sensor may comprise forming a hardmask pattern on a substrate, etching at least one cavity in the substrate based on the hardmask pattern, the at least one cavity having a cavity profile and configured to accept a sensor pixel structure of the image sensor, removing the hardmask pattern from the substrate, forming at least one conformal passivation layer in the at least one cavity, forming at least one conformal optical layer in the at least one cavity on at least a portion of the at least one conformal passivation layer, wherein the at least one conformal optical layer is configured to provide, at least, pixel-to-pixel optical isolation of the sensor pixel structure, and forming the sensor pixel structure in the at least one cavity on the at least one conformal optical layer of the sensor pixel structure.

In some embodiments, the method may further include forming the sensor pixel structure using an atomic layer deposition (ALD) process or a chemical vapor deposition (CVD) process and crystallizing the sensor pixel structure, adjusting an amount of stress applied to the sensor pixel structure by altering the cavity profile, wherein adjusting the amount of stress increases a quantum efficiency of the sensor pixel structure, and/or forming a charge passivation layer prior to forming the sensor pixel structure, wherein the charge passivation layer is configured to increase a quantum efficiency of the sensor pixel structure.

In some embodiments, a non-transitory, computer readable medium having instructions stored thereon that, when executed, cause a method for forming an image sensor to be performed, the method may comprise forming a cavity into a substrate, the cavity having a cavity profile and configured to accept a sensor pixel structure of the image sensor, forming at least one passivation layer in the cavity, forming at least one optical layer in the cavity on the at least one passivation layer, wherein the at least one optical layer is configured to provide, at least, pixel-to-pixel optical isolation of the sensor pixel structure, and forming the sensor pixel structure in the cavity on the at least one optical layer of the sensor pixel structure.

In some embodiments, the method may further include wherein the cavity profile is configured to control stress on the sensor pixel structure to increase quantum efficiency and/or wherein one of the at least one optical layer is a distributed Bragg reflector (DBR) configured to provide optical isolation for the sensor pixel structure.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
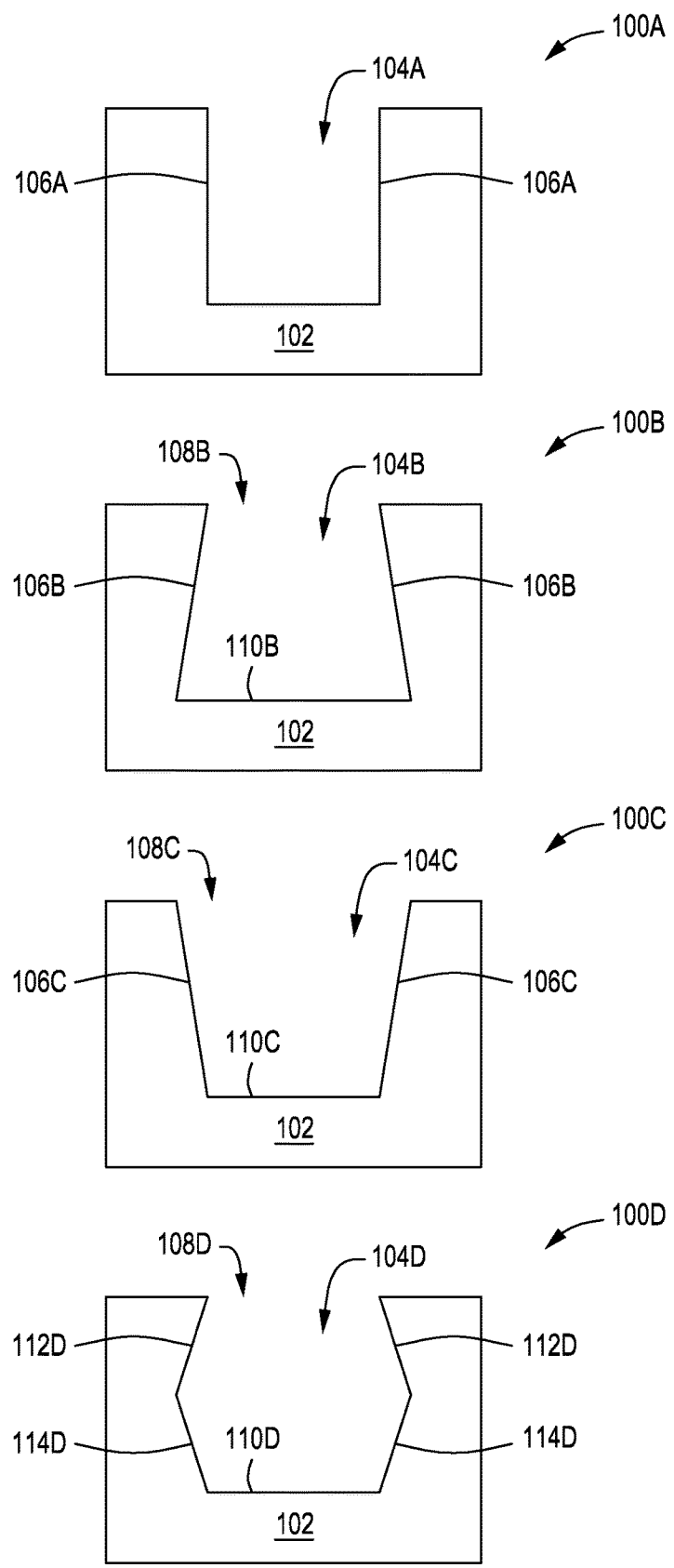
FIG. 1 depicts a cross-sectional view of a cavity with different cavity profiles in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods enable formation of image sensors with simplified manufacturing workflows while improving the performance and scalability of the image sensors. The methods combine image sensor material formation, composition engineering, surface passivation, work function engineering, and/or stress engineering all in one single workflow step or in integrated workflow steps. The methods allow homogeneous-materials or heterogeneous-materials device fabrications by integrating material engineering, device architecture, and device design. In comparison with conventional methods which require multiple steps, the methods have the potential to enable a new type of device structure with a highly simplified fabrication flow. The methods also have the advantages of reducing damage on device structures and materials during fabrication while addressing lattice mismatch, wafer bowing, and other issues for heterogeneous materials device fabrication. The methods combine mirror, filter, charge, work function, and/or isolation engineering methods in a single step or in simplified steps. The methods provide a new process of sensor quantum efficiency engineering and also enable integrating emitter and sensor on the same wafer. In existing image sensor fabrication workflows, a silicon substrate is implanted with dopants to form a sensor. Implanting can be a long and tedious process requiring repeated (sometimes 30 or more) implantation steps. Because the implantation is performed on the silicon substrate, the sensor pixel structure is restricted to being a doped silicon variant. The methods of the present principles allow the introduction of new materials into the formation of the sensor pixel structure, increasing performance and throughput at the same time.

Figure 9:
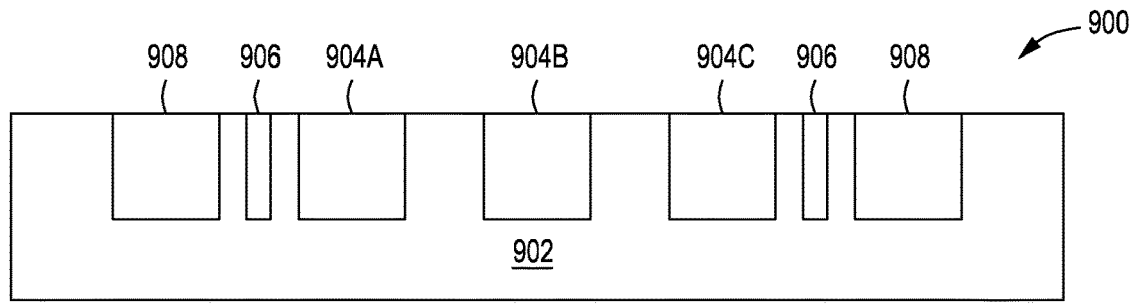
FIG. 9 depicts a cross-sectional view of a plurality of cavities surrounded by an external isolation structure in accordance with some embodiments of the present principles.
Figure 10:
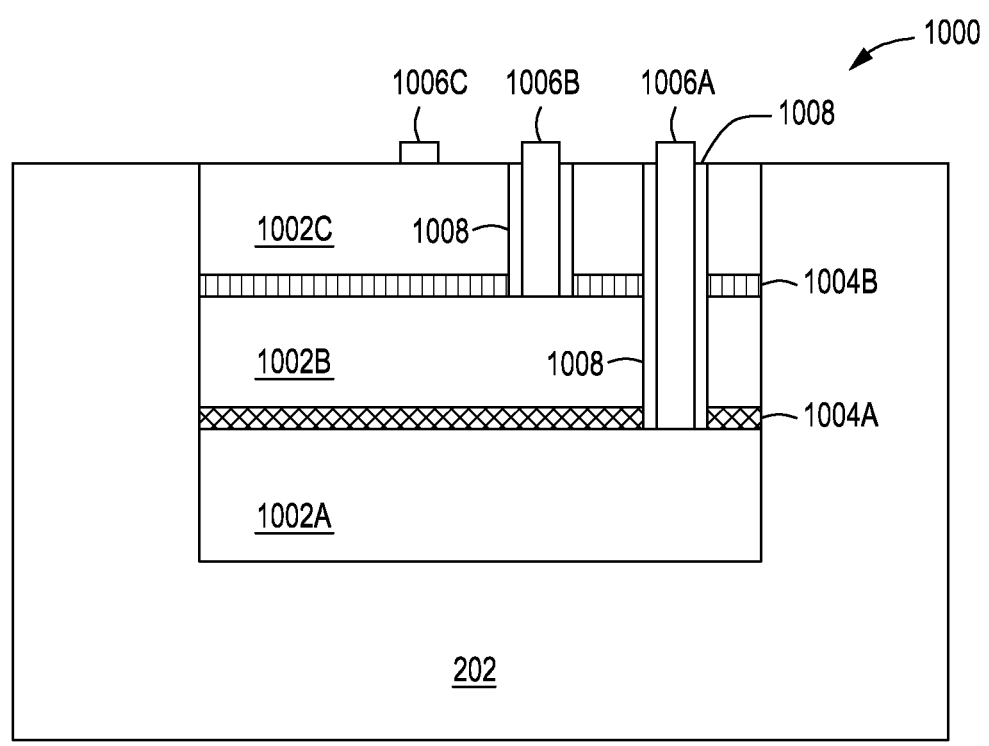
FIG. 10 depicts a cross-sectional view of an image sensor with a stacked sensor pixel structure in accordance with some embodiments of the present principles.
Figure 11:
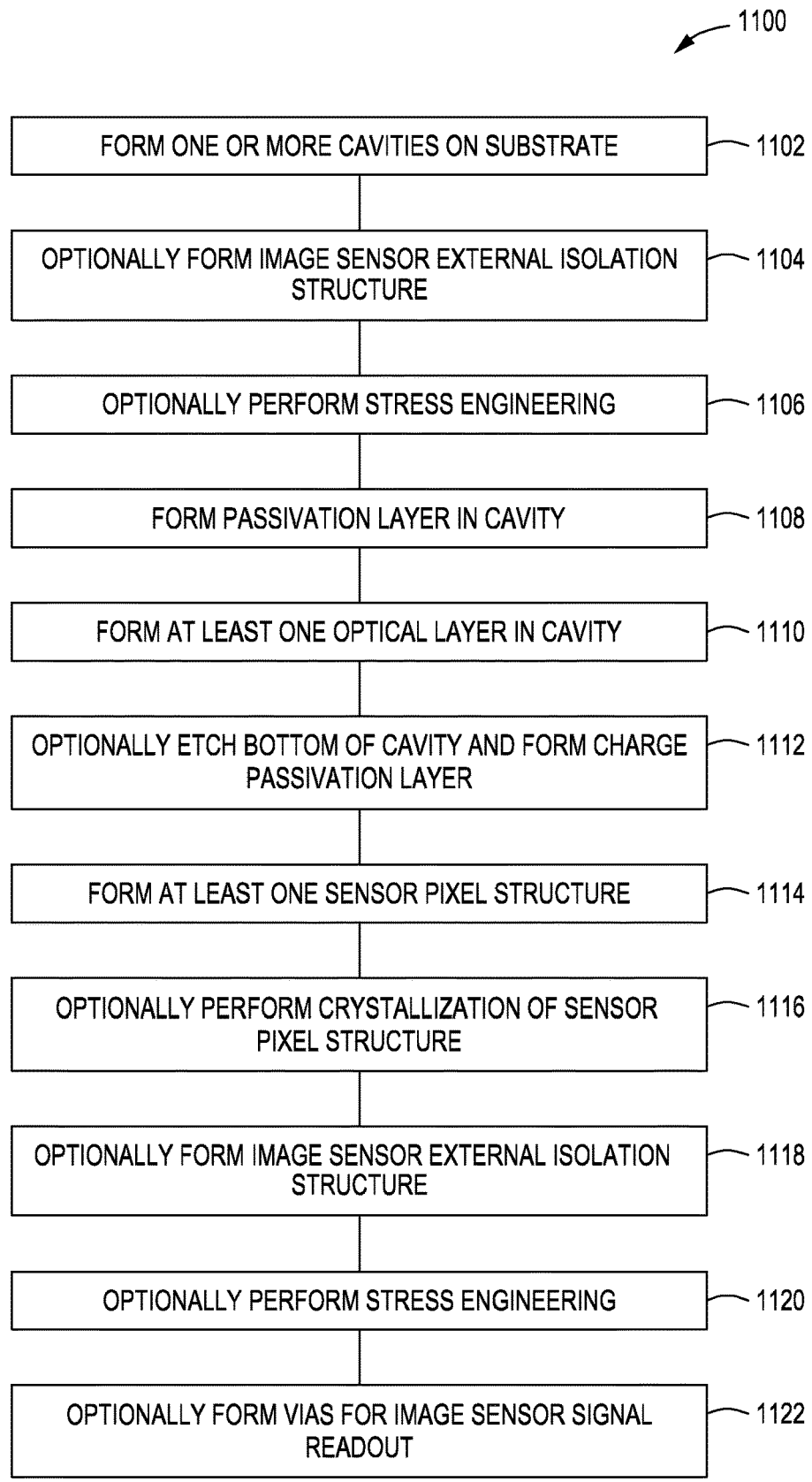
FIG. 11 is a method of forming an image sensor in accordance with some embodiments of the present principles.
Figure 12:
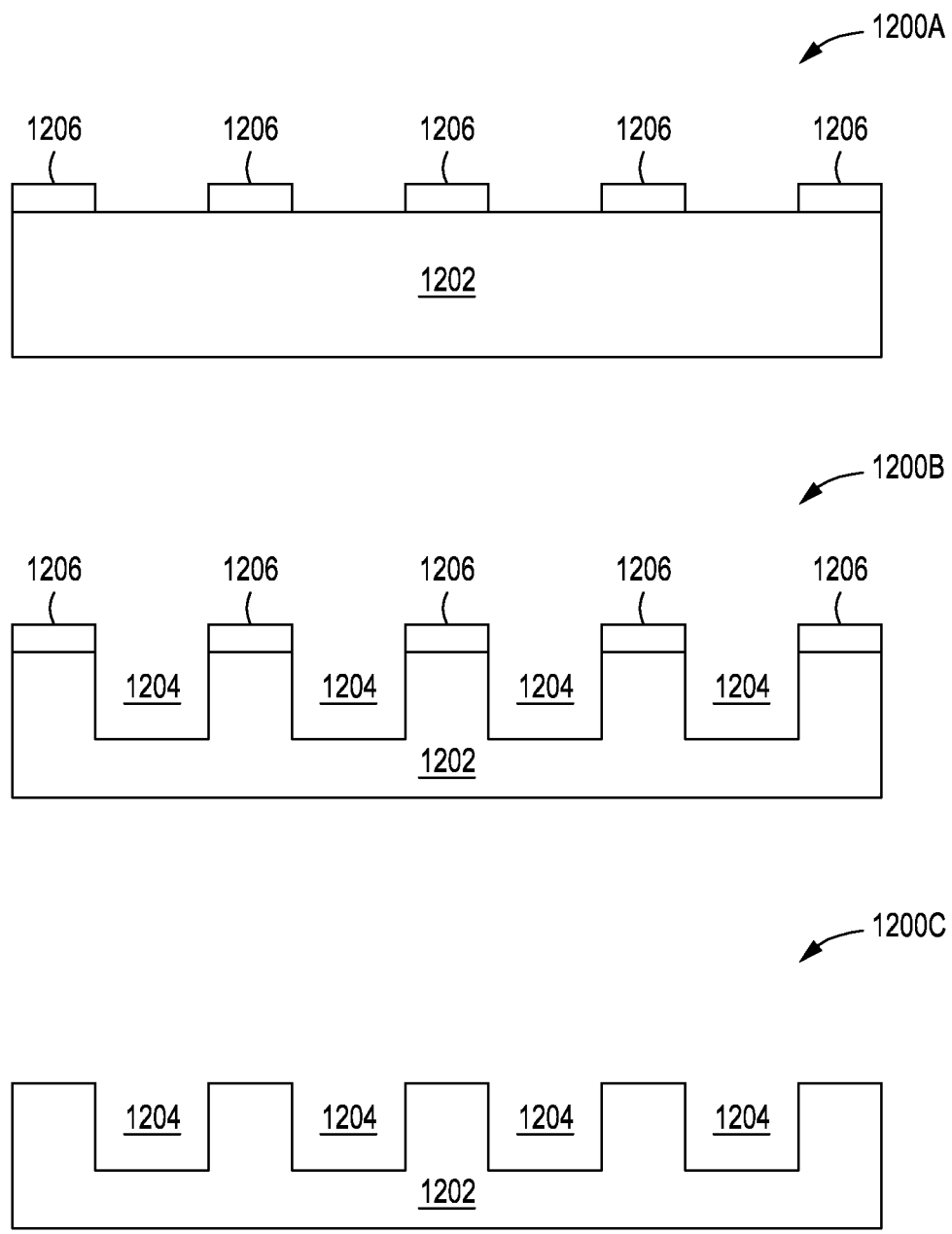
FIG. 12 depicts cavities formed in a substrate material in accordance with some embodiments of the present principles
Figure 13:
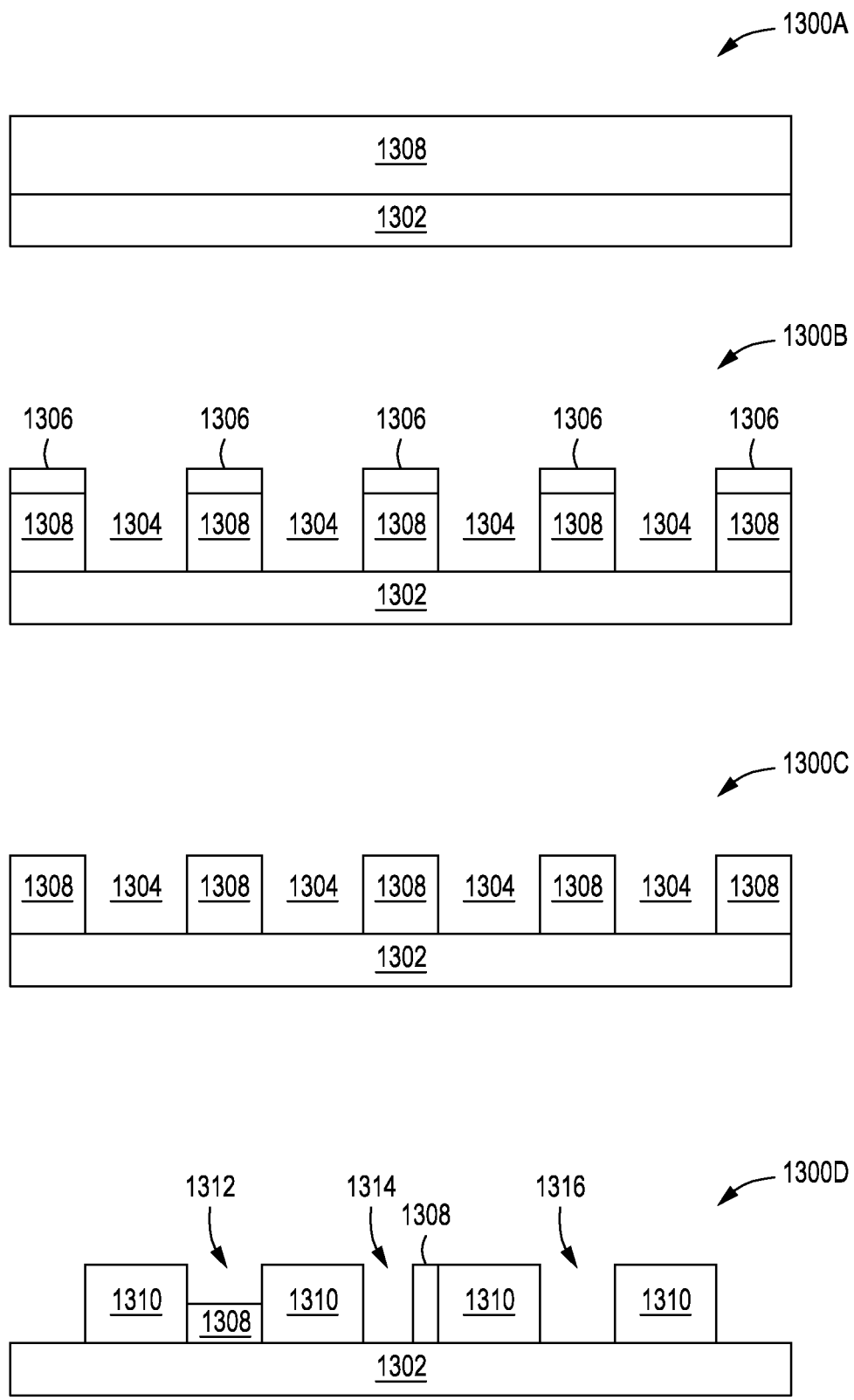
FIG. 13 depicts cavities formed in a mold layer on a substrate in accordance with some embodiments of the present principles.

An example method 1100 is depicted in FIG. 11 with reference to FIGS. 1-10, 12, and 13. In block 1102, one or more cavities are formed on a substrate. The phrase "formed on a substrate" as used herein includes cavities that are etched into the substrate material as well as cavities that are formed in a layer of mold material on an upper surface of the substrate. In some embodiments, the substrate may be a silicon-based material and the like. In some embodiments, the one or more cavities 1204 may be formed on the substrate 1202 by using a patterned hardmask 1206 as depicted in a view 1200A of FIG. 12. By using an etching process, the substrate 1202 is etched away and the one or more cavities 1204 are formed in the substrate 1202 as in a view 1200B of FIG. 12. The patterned hardmask 1206 is then removed leaving the one or more cavities 1204 in the substrate 1202 as depicted in a view 1200C of FIG. 12. The patterned hardmask 1206 can also be kept in support of selective deposition and removed after the sensor pixel structure formation. In some embodiments, the one or more cavities 1304 may be formed by first depositing a mold layer 1308 on the substrate 1302 as depicted in a view 1300A of FIG. 13. The patterned hardmask 1306 and the mold layer 1308 can also be combined as one layer. An etching process is then used to form the one or more cavities 1304 in the mold layer 1308 on the substrate 1302 as depicted in a view 1300B of FIG. 13. The patterned hardmask 1306 is then removed leaving the one or more cavities 1304 on the substrate 1302 as depicted in a view 1300C of FIG. 13. In some embodiments, the mold layer 1308 may be removed after formation of the emitter pixel structures 1310 as depicted in view 1300D of FIG. 13 and as described below.

As depicted in views 100A, 100B, 100C, and 100D of FIG. 1, cavity engineering can be used to shape the cavity based on a cavity profile that can influence an amount of stress acting on the sensor pixel structure that will be formed inside of the cavity 104A-104D. When a different material is formed inside the substrate material or inside the mold layer (herein the substrate material or the mold layer will be referred to as "the cavity layer" for the sake of brevity), stresses and strains will be induced on the different material due to lattice mismatches, stress memory effect (as found in the substrate material cavity or the mold layer cavity approach) and the cavity profile. Herein, "stress" is used to encompass both stresses and strains (compressive and tensile forces) for brevity. In view 100A, a cavity 104A formed in the cavity layer 102 has parallel walls 106A that may exhibit an even amount of stress and/or an electric field from a charge layer throughout the sensor pixel structure. In view 100B, a cavity 104B has angled walls 106B that are closer near a top 108B of the cavity 104B than at a bottom 1106 of the cavity 1046 that may exhibit an increased downward stress and/or work-function/electric-field from a charge layer on lower portions of the sensor pixel structure and increased inward stress and/or work-function/electric-field from a charge layer on upper portions of the sensor pixel structure. In view 100C, a cavity 104C has angled walls 106C that are closer near a bottom 110C of the cavity 104C than at a top 108C of the cavity 104C that may exhibit a decreased downward stress and/or work-function/electric-field from a charge layer on lower portions of the sensor pixel structure and decreased inward stress and/or work-function/electric-field from a charge layer on upper portions of the sensor pixel structure. In view 100D, a cavity 104D has inward angled walls 112D in an upper portion of the cavity 104D and outward angled walls 114D in a lower portion of the cavity 104D near a bottom 110D that may exhibit an increased inward stress and/or work-function/electric-field from a charge layer on the upper portion and a downward stress and/or work-function/electric-field from a charge layer on the lower portion that may be counteracted by the outward angled walls 114D. The cavity engineering can be used to influence stresses and/or work-functions/electric-fields from a charge layer on the pixel and structure and also to scale the sensor pixel structure. The cavity engineering can also be used to streamline the fabrication process by selecting and designing a cavity that requires less intensive processing. One skilled can also appreciate that stresses and/or work-functions/electric-fields from a charge layer within the sensor pixel structure are also impacted by isolation engineering (discussed below). The shape and angles of the walls of the cavity in conjunction with material selection and processing of external isolation structures near the cavity will influence the amount and location of stresses and/or work-functions/electric-fields within the cavity and both may be used to adjust the amount of stress. Shape and angles also enable three-dimensional stresses and/or work-function/electric-field engineering which will enhance and modulate quantum efficiency at different pixel locations. The use of angled cavity surface examples is not meant to be limiting. One skilled in the art will also understand that the surfaces that form the cavity may be angled and/or curved.

In the following descriptions, a cavity having a cavity profile with parallel walls will be used for the sake of brevity, but the parallel walled cavity is not meant to be limiting in any manner. In block 1104, as shown in a view 800 of FIG. 8, at least one image sensor external isolation structure is optionally formed at least one cavity formed in a cavity layer 802. Herein, the term "external" is used for isolation structures that do not reside within the walls of the cavity. The external isolation structures 806 are used to adjust the amount of stress acting on the sensor pixel structure that will be formed within the cavity 804. Block 1104 is optional because the external isolation structures 806 may be formed prior to and/or after the formation of the sensor pixel structure in the cavity 804 (see, e.g., block 1118 below) or may not be needed at all. The external isolation structures may be, for example but not limited to, shallow trench isolation (STI) structures and/or deep trench isolation (DTI) structures. If the cavity 804 is formed in a mold layer, the mold layer material may be considered an external isolation structure and be adjusted (e.g., material selection such as dielectric or metal materials, dopants, annealing processes, etc.) to produce varying stress levels and force directions on the sensor pixel structure subsequently formed in the cavity 804 (see stress engineering examples below). In some embodiments, the mold layer may be partially removed (see, e.g., nonlimiting examples—upper portion removed 1312 or side portion removed 1314 and the like of view 1300D of FIG. 13) or completely removed (e.g., completely removed 1316 of view 1300D of FIG. 13) to produce varying stress levels on the emitter pixel structure.

In block 1106, stress engineering is optionally performed. As discussed above, the stress engineering may be performed prior to and/or after the formation of the sensor pixel structure in a cavity. Stress engineering involves altering stresses on a sensor pixel structure to increase the sensor pixel structure's performance by increasing the sensor pixel structure's quantum efficiency. Quantum efficiency is the percentage of photons that impinge on the sensor pixel structure that are converted into electrons. The stress engineering of the sensor pixel structure may also make use of material selections used to gapfill the trenches or other isolation structures to further influence the amount of stress acting on the sensor pixel structure. The stress can be engineered to be compressive or tensile stress. The amount of stress can also be even further influenced or adjusted by curing the material in the external isolation structures, implanting dopants into the material in the external isolation structures, and/or annealing of the material in the external isolation structures, etc. The multitude of ways available (including leveraging the cavity engineering as described above) for adjusting the amount of stress acting on the sensor pixel structure allows for infinite levels of stress control (amount of stress, direction of stress forces, etc.) that is not otherwise achievable, yielding substantially higher performances for image sensors. Another technique available for stress engineering, as shown in a view 900 of FIG. 9, is to place external isolation structures 906 around a plurality of cavities 904A-C formed in a cavity layer 902. The amount of stress is adjusted differently for sensor pixel structures in cavities 904A, 904C closest to the external isolation structures 906 than sensor pixel structures in cavities 904B farthest from the external isolation structures 906. Cavities 908 outside of the external isolation structures will have diminished effects of the stress control provided by the external isolation structures as the distance away from the external isolation structures increases.

Figure 2:
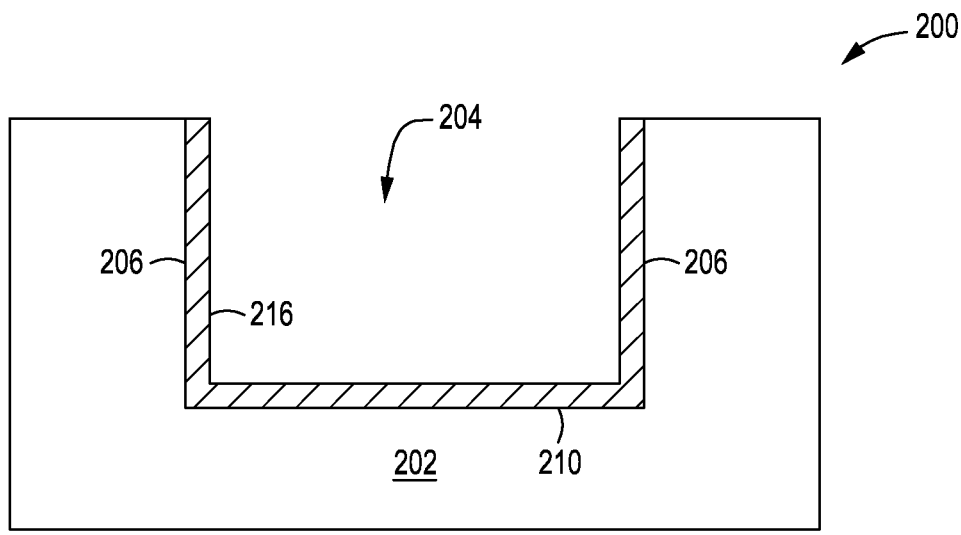
FIG. 2 depicts a cross-sectional view of a cavity with a passivation layer formed inside the cavity in accordance with some embodiments of the present principles.

In block 1108, a passivation layer 216 is formed in a cavity 204 in a substrate 202 as depicted in a view 200 of FIG. 2. In some embodiments, the passivation layer 216 is a conformal layer that is formed on the walls 206 and the bottom 210 of the cavity. The passivation layer 216 may have a thickness of approximately 10Å to approximately 200Å. The passivation layer 216 may be comprised of dopants or high k materials. After forming a cavity, surfaces of the cavity generally exhibit crystal damage caused by the processes used to form the cavity. The crystal damage or defects can generate electrical signals (dark noise) even if no light is impinging on the image sensor. The passivation layer serves to passivate or recombine and cancel the errant electrical signals (dark noise), increasing the image sensor's signal to noise ratio performance.

Figure 3:
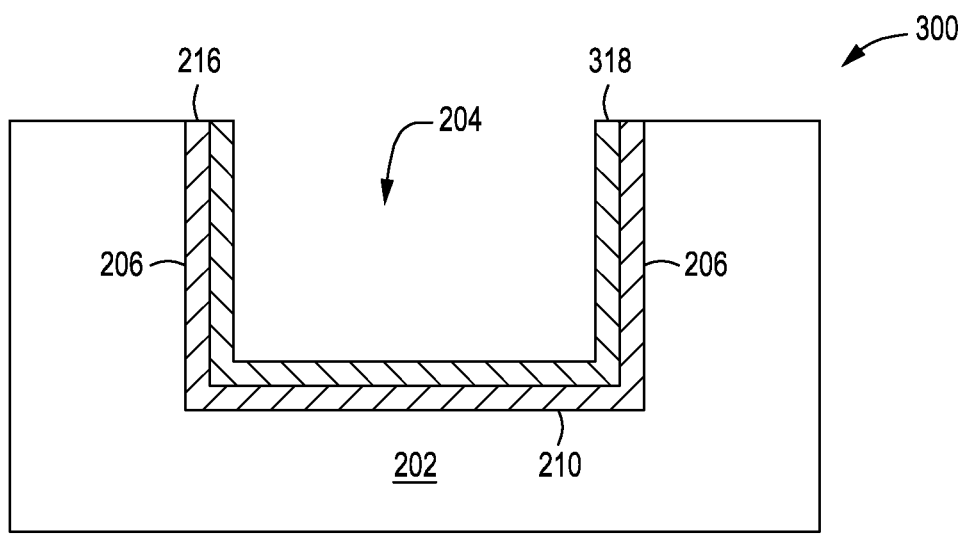
FIG. 3 depicts a cross-sectional view of a cavity with a DBR layer formed on a passivation layer in accordance with some embodiments of the present principles.

In block 1110, at least one optical layer is formed in the cavity 202 as depicted in a view 300 of FIG. 3. In some embodiments (as shown in FIG. 3), the optical layer 318 is formed on the passivation layer 216. In some embodiments as depicted in a view 1000 of FIG. 10, a plurality of optical layers 1004A-B may be formed on a plurality of sensor pixel structures 1002A-C to separate and filter different wavelengths from reaching different sensor pixel structures in a stacked sensor pixel structure (see below). The optical layer 318 may have a thickness of approximately 50 nm to approximately 200 nm. The optical layer 318 may function as a reflective optical layer and/or a filter (such as, but not limited to, a bandpass filter, etc.) to provide optical isolation of the sensor pixel structure formed within the cavity 204. In some embodiments, the optical layer 318 may be augmented through implantation or doping to also provide a charge passivation and/or a further isolation function. In some embodiments, the optical layer 318 may be comprised of dielectric and/or metal material. In some embodiments, the optical layer 318 may form a distributed Bragg reflector (DBR) layer. The DBR layer influences optical wavelengths by alternating layers of different materials with varying refractive indexes. Optical waves are reflected at each of the layer boundaries. Different layer configurations can be used to provide complete optical reflection as a mirror or only at certain wavelengths as a filter. In some embodiments, the optical layer 318 may form a DBR filter layer to function as an optical filter. The DBR filter layer can be used to reflect certain wavelengths of light while permitting other wavelengths of light to pass. The DBR filter layer may be used in conjunction with stacked sensor pixel structures found in RGB (red/green/blue) image sensors (see, e.g., FIG. 10) as a bandpass filter to allow different wavelengths to pass or to be reflected. The DBR layers may be deposited using an ALD or CVD deposition process or epitaxially grown.

Figure 4:
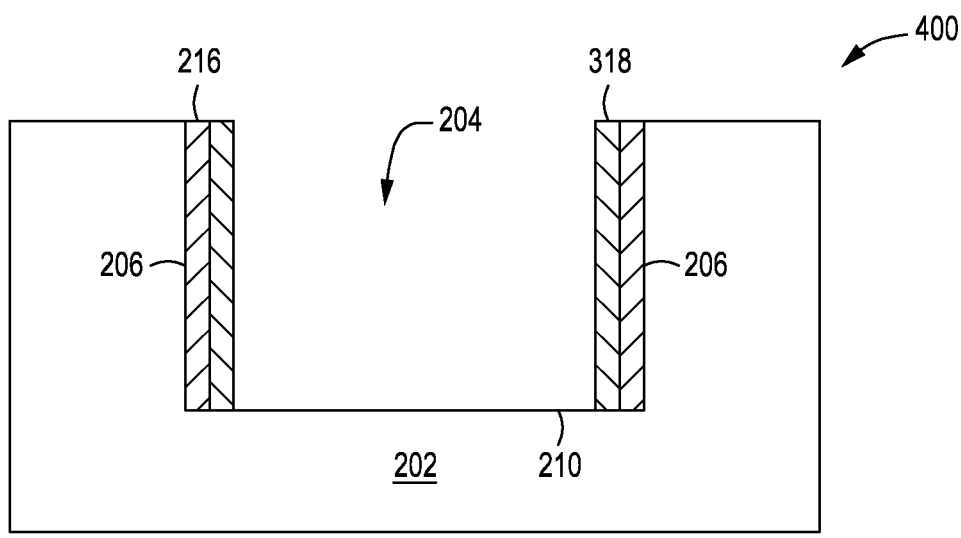
FIG. 4 depicts a cross-sectional view of a cavity with an exposed bottom surface in accordance with some embodiments of the present principles.
Figure 5:
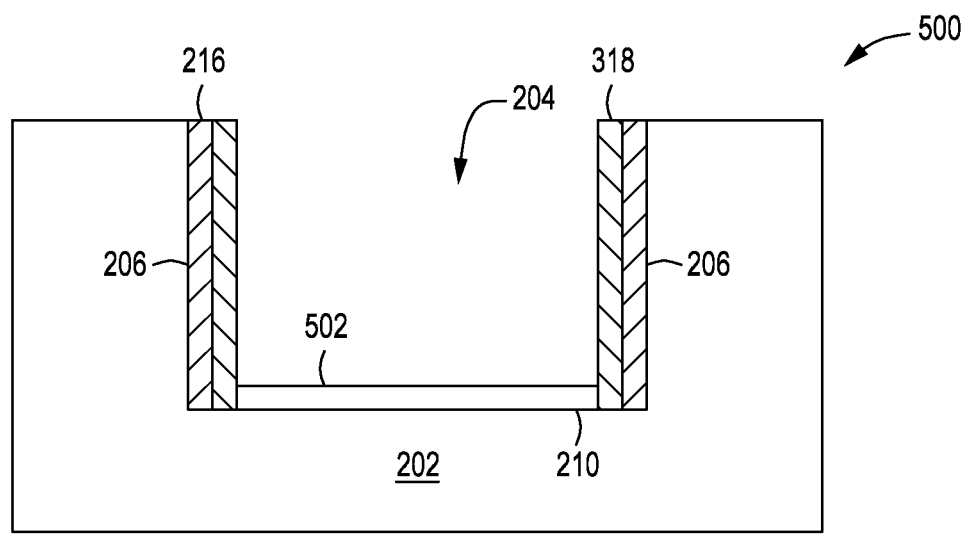
FIG. 5 depicts a cross-sectional view of a cavity with a charge passivation layer in accordance with some embodiments of the present principles.
Figure 6:
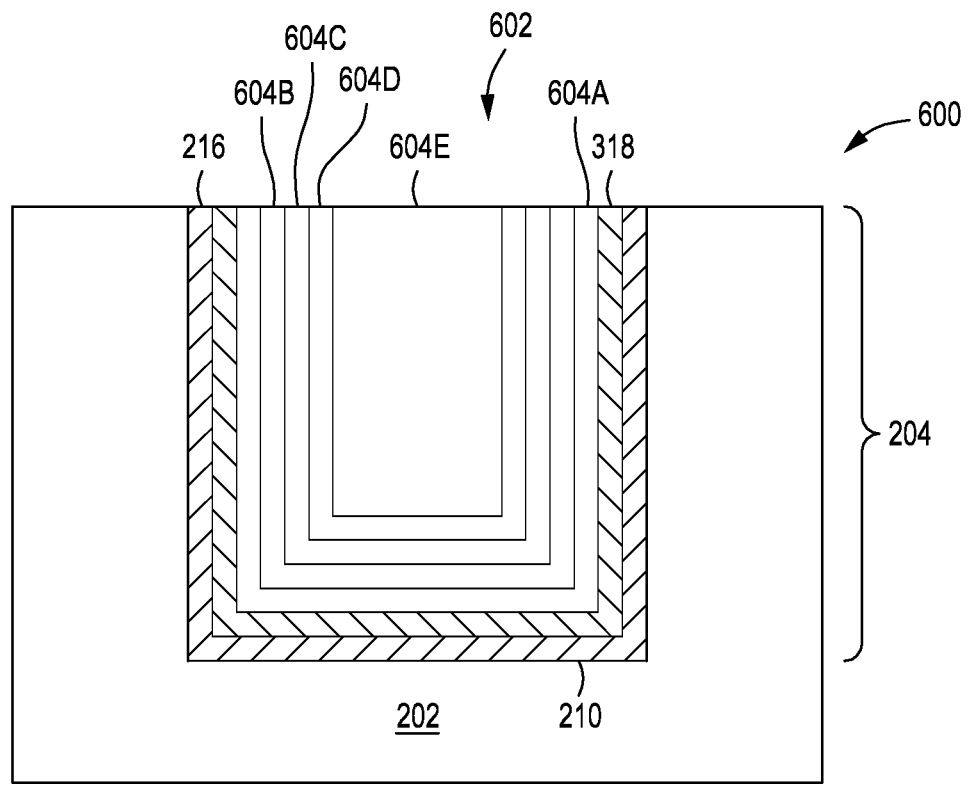
FIG. 6 depicts a cross-sectional view of a sensor pixel structure formed by deposition in accordance with some embodiments of the present principles.

In block 1112, the bottom 210 of the cavity 204 is optionally etched to remove any depositions from the bottom of the cavity as depicted in a view 400 of FIG. 4 and a charge passivation layer 502 is optionally formed on the bottom 210 of the cavity 204 as depicted in a view 500 of FIG. 5. The bottom 210 of the cavity 204 may be etched to expose the substrate material if a subsequent sensor pixel structure formation process will use epitaxial growth. The etching can cause damage to the crystal structure of the substrate material and a charge passivation layer 502 may be used to rectify the damage from the etching process. The charge passivation layer 502 serves a dual function in that the charge passivation layer 502 passivates or minimizes the crystal defects while also carrying a charge that influences the work function of the sensor pixel structure to increase the image sensor's quantum efficiency.

In block 1114, at least one sensor pixel structure is formed in the cavity 204. In some embodiments as depicted in a view 600 of FIG. 6, the sensor pixel structure 602 is formed by, for example, ALD deposition, CVD deposition, or epitaxial growth processes in a conformal manner. The "layers" 604A-E are meant to represent the compositional control over the internal structure of the sensor pixel structure 602 that is obtained by performing the method of the present principles. For example, the boundaries of the "layers" 604A-E may be dopant gradient transitions and the like. The number of "layers" may be more or less, and five layers is not meant to be limiting in any manner or to imply that the internal structure of the sensor pixel structure has distinct layers. As the sensor pixel structure 602 is deposited by deposition, various dopant gases at various rates and densities may be used to dope the deposited material with high control during a single deposition process, dramatically increasing throughput while increasing performance of the image sensor.

Figure 7:
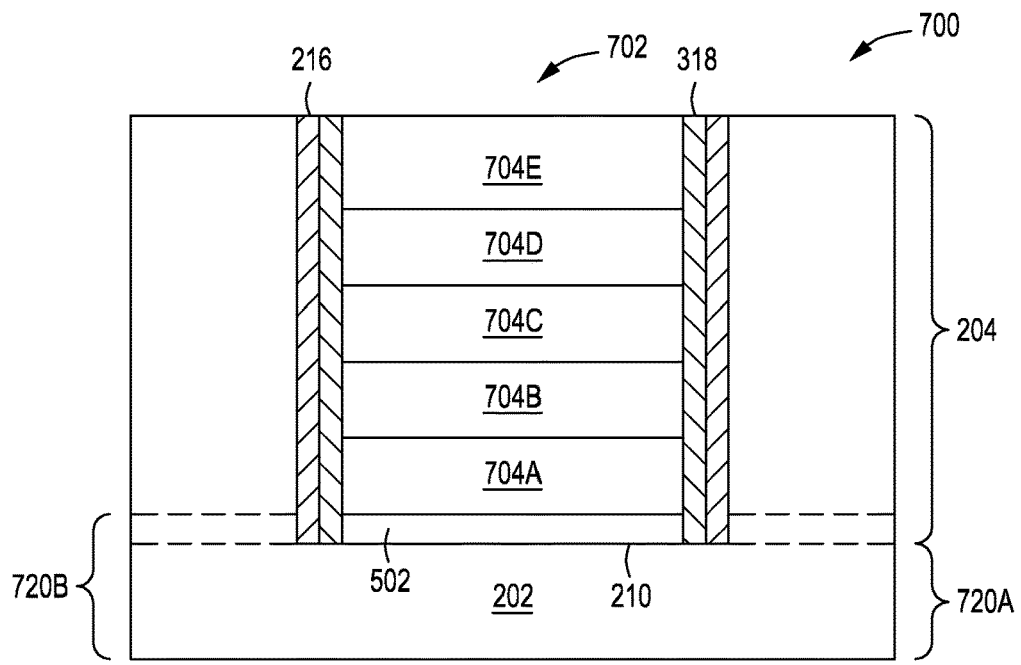
FIG. 7 depicts a cross-sectional view of a sensor pixel structure formed by epitaxial growth or other deposition techniques in accordance with some embodiments of the present principles.

In some embodiments as depicted in a view 700 of FIG. 7, the sensor pixel structure 702 is formed in a nonconformal manner by, for example, epitaxial growth using a molecular beam epitaxy (MBE) process or other deposition techniques or selective deposition processes and the like. The "layers" 704A-E are meant to represent the compositional control over the internal structure of the sensor pixel structure 702 that is obtained by performing the method of the present principles. For example, the boundaries of the "layers" 704A-E may be dopant gradient transitions and the like. The number of "layers" may be more or less, and five layers is not meant to be limiting in any manner or to imply that the internal structure of the sensor pixel structure has distinct layers. As the sensor pixel structure 702 is formed by epitaxial growth or selective deposition processes, various dopant gases at various rates and densities may be used to dope the deposited material with high control during a single epitaxial growth or selective deposition process, dramatically increasing throughput while increasing performance of the image sensor. In some embodiments, a plurality of sensor pixel structures 1002A-C may be formed in a single cavity as depicted in a view 1000 of FIG. 10. In some embodiments, further stress engineering techniques may be performed during the formation of the sensor pixel structure. During formation of the sensor pixel structure, materials or dopants may be selected to increase/decrease stress within the pixel structure. In some embodiments, passivation, DBR mirror/filter, isolation, and work function may be achieved as a single process during the formation of the sensor pixel structure, increasing throughput and performance while reducing costs. If a backside illumination (BSI) scheme is adopted, the cavity layer 202 is polished (e.g., chemical mechanical polishing (CMP)) to remove a first portion 720A or a second portion 720B of the bottom of the cavity layer 202 to expose the layer 704A with layer 502 as an etching stop or to expose the charge passivation layer 502 then followed by the rest of the optical layer fabrications.

In block 1116, a crystallization process is optionally performed on the sensor pixel structure. When a sensor pixel structure is deposited in a cavity as opposed to epitaxially grown, the sensor pixel structure could be in a non-crystalline form that will inhibit the sensor pixel structure's performance. By performing the crystallization process on a deposited sensor pixel structure, the dislocation or defect density of the crystals of the sensor pixel structure can be reduced, yielding a higher performing image sensor. The crystallization process may include subjecting the sensor pixel structure to high heat and pressure. For example, the temperature may range from approximately 400 degrees Celsius to approximately 1200 degrees Celsius, the pressure may range from approximately 1 Torr to approximately 760 Torr, and the duration may range from a few nanoseconds to approximately 1 hour. The crystallization process is optional because sensor pixel structures grown by epitaxial growth do not need crystallization to increase performance of the image sensor.

Figure 8:
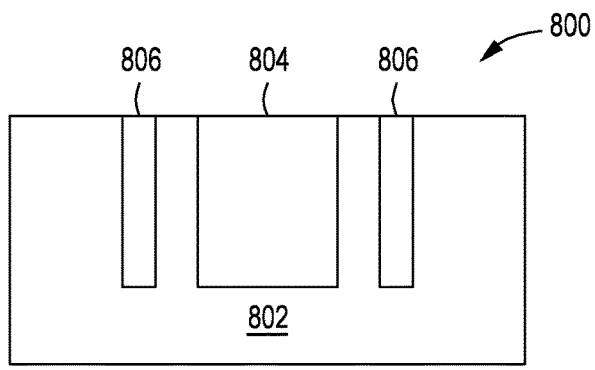
FIG. 8 depicts a cross-sectional view of a cavity surrounded by an external isolation structure in accordance with some embodiments of the present principles.

In block 1118, as shown a view 800 of FIG. 8, at least one image sensor external isolation structure is optionally formed near at least one cavity formed in a cavity layer 802. The external isolation structure may be optional if the external isolation structure has been previous formed prior to the sensor pixel structure formation as described in block 1104. In some embodiments, the external isolation structure may be formed both prior to and after the formation of the sensor pixel structure may use different types of external isolation structures (e.g., combination of shallow and deep trenches with same or different materials/treatment, etc.). As noted above, the term "external" is used for isolation structures that do not reside within the walls of the cavity 804. The external isolation structures 806 are used to adjust the amount of stress acting on the sensor pixel structure that is formed within the cavity 804. The external isolation structures 806 may be, for example but not limited to, shallow trench isolation (STI) structures and/or deep trench isolation (DTI) structures and the like. If the cavity 804 is formed in a mold layer, the mold layer material may be considered an external isolation structure and may be adjusted (e.g., material selection such as dielectric or metal materials, dopants, annealing processes, etc.) to produce varying stress levels and force directions on the sensor pixel structure subsequently formed in the cavity 804 (see stress engineering examples below). In some embodiments, the mold layer may be partially or completely removed to produce varying stress levels on the sensor pixel structure.

In block 1120, stress engineering is optionally performed. As discussed above, the stress engineering may be performed prior to and/or after the formation of the sensor pixel structure in a cavity. The stress engineering of the sensor pixel structure may also make use of material selections used to gapfill the trenches or other isolation structures to further influence the amount of stress acting on the sensor pixel structure. The amount of stress can also be even further influenced or adjusted by curing the material in the external isolation structures, implanting dopants into the material in the external isolation structures, and/or annealing of the material in the external isolation structures, etc. The multitude of ways available (including leveraging the cavity engineering as described above) for adjusting the amount of stress acting on the sensor pixel structure allows for fine levels of stress control that is not otherwise achievable, yielding substantially higher performances out of image sensors. Another technique available for stress engineering, as shown in FIG. 9, is to place external isolation structures 906 around a plurality of cavities 904A-C formed in a cavity layer 902. The amount of stress is adjusted differently for sensor pixel structures in cavities 904A, 904C closest to the external isolation structures 906 than sensor pixel structures in cavities 904B farthest from the external isolation structures 906. Cavities 908 outside of the external isolation structures will have diminished effects of the stress control provided by the external isolation structures as the distance away from the external isolation structures increases.

In block 1122, vias are optionally formed for image sensor signal readout as depicted in a view 1000 of FIG. 10. In some embodiments that utilize a plurality of stacked sensor pixel structures 1002A-C, via passages may be etched to one or more of the underlying sensor pixel structures to allow the formation of vias 1006A-B that have electrical isolation 1008 from any sensor pixel structures that the vias extend through. The vias 1006A-C provide the capability of having single sided-contacts available for further integration processes.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for forming an image sensor, comprising:
   forming a cavity on a substrate, the cavity having a cavity profile and configured to accept a sensor pixel structure of the image sensor;
   forming at least one passivation layer in the cavity;
   forming at least one optical layer in the cavity on at least a portion of one of the at least one passivation layer, wherein the at least one optical layer is configured to provide, at least, pixel-to-pixel optical isolation of the sensor pixel structure; and
   forming the sensor pixel structure in the cavity on the at least one optical layer of the sensor pixel structure, wherein the cavity profile is configured to control stress on the sensor pixel structure.

2. The method of claim 1, further comprising:
   forming the sensor pixel structure using an atomic layer deposition (ALD) process, a chemical vapor deposition (CVD) process, or a molecular beam epitaxy (MBE) process; and
   crystallizing the sensor pixel structure.

3. The method of claim 1, wherein the at least one passivation layer or the at least one optical layer is conformally deposited into the cavity.

4. The method of claim 1, wherein the image sensor includes multiple stacked sensor pixel structures within the cavity separated by optical layers.

5. The method of claim 1, wherein the at least one optical layer includes a distributed Bragg reflector (DBR) mirror layer or a DBR filter layer.

6. The method of claim 1, further comprising:
   depositing a charge passivation layer in the cavity prior to forming the sensor pixel structure, the charge passivation layer configured to increase a quantum efficiency of the image sensor by altering a work function or an electric field of the sensor pixel structure.

7. The method of claim 1, further comprising:
   adjusting an amount of stress applied to the sensor pixel structure prior to or after formation of the sensor pixel structure in the cavity, wherein adjusting the amount of stress increases a quantum efficiency of the sensor pixel structure.

8. The method of claim 7, wherein the amount of stress is adjusted by placing at least one isolation structure external of the cavity of a material different from the substrate beside the cavity and wherein the amount of stress is further adjusted by differing material selections of the material different from the substrate for the external isolation structure.

9. The method of claim 8, wherein the at least one isolation structure is at least one shallow trench isolation structure or at least one deep trench isolation structure gapfilled with the material different from the substrate.

10. The method of claim 7, wherein the amount of stress is adjusted by curing processes, implanting dopants, or annealing processes prior to or after forming the sensor pixel structure.

11. The method of claim 1, further comprising:
    etching a bottom of the cavity to reveal substrate material; and
    forming the sensor pixel structure in the cavity using an epitaxial growth process.

12. The method of claim 1, further comprising:
    forming a plurality of stacked sensor pixel structures in the cavity separated by optical layers; and
    forming a plurality of electrical contact vias to each of the plurality of stacked sensor pixel structures only on a single side of the image sensor.

13. The method of claim 1, wherein the at least one optical layer is formed of a metal material or dielectric material.

14. A method for forming an image sensor, comprising:
   forming a hardmask pattern on a substrate;
   etching at least one cavity in the substrate based on the hardmask pattern, the at least one cavity having a cavity profile and configured to accept a sensor pixel structure of the image sensor;
   removing the hardmask pattern from the substrate;
   forming at least one conformal passivation layer in the at least one cavity;
   forming at least one conformal optical layer in the at least one cavity on at least a portion of the at least one conformal passivation layer, wherein the at least one conformal optical layer is configured to provide, at least, pixel-to-pixel optical isolation of the sensor pixel structure; and
   forming the sensor pixel structure in the at least one cavity on the at least one conformal optical layer of the sensor pixel structure.

15. The method of claim 14, further comprising:
   forming the sensor pixel structure using an atomic layer deposition (ALD) process or a chemical vapor deposition (CVD) process; and
   crystallizing the sensor pixel structure.

16. The method of claim 14, further comprising:
   adjusting an amount of stress applied to the sensor pixel structure by altering the cavity profile, wherein adjusting the amount of stress increases a quantum efficiency of the sensor pixel structure.

17. The method of claim 14, further comprising:
   forming a charge passivation layer prior to forming the sensor pixel structure, wherein the charge passivation layer is configured to increase a quantum efficiency of the sensor pixel structure.

18. A non-transitory, computer readable medium having instructions stored thereon that, when executed, cause a method for forming an image sensor to be performed, the method comprising:
   forming a cavity into a substrate, the cavity having a cavity profile and configured to accept a sensor pixel structure of the image sensor;
   forming at least one passivation layer in the cavity;
   forming at least one optical layer in the cavity on the at least one passivation layer, wherein the at least one optical layer is configured to provide, at least, pixel-to-pixel optical isolation of the sensor pixel structure; and
   forming the sensor pixel structure in the cavity on the at least one optical layer of the sensor pixel structure.

19. The non-transitory, computer readable medium of claim 18, wherein the cavity profile is configured to control stress on the sensor pixel structure to increase quantum efficiency.

20. The non-transitory, computer readable medium of claim 18, wherein one of the at least one optical layer is a distributed Bragg reflector (DBR) configured to provide optical isolation for the sensor pixel structure.

* * * * *